United States Patent Office 2,981,646

Patented Apr. 25, 1961

2,981,646

PROCESS OF FORMING BARRIER LAYERS

Preston Robinson, Williamstown, Mass., assignor to Sprague Electric Company, North Adams, Mass., a corporation of Massachusetts No Drawing. Filed Feb. 11, 1958, Ser. No. 714,474

4 Claims. (Cl. 148—1.5)

This invention relates to the creation of a junction in semiconductive materials and more particularly to introducing materials into single crystals of semiconductive materials to create a junction or barrier.

In junction transistors it is important to make the collector capacitance as small as possible. This has resulted in an effort of prior art to reduce the distance between the two sides of the transistor. The germanium transistors, for example, which are thin slices of germanium are further processed to bring the electrodes into an effective spacing of less than one-thousandth of an inch. Various methods have been employed to produce this effective spacing of less than one-thousandth of an inch. One such method is a diffusion process in which indium is diffused from both sides of the transistor under control conditions of time and temperature. By this control it is intended that the diffusion will result in the desired effective spacing between the layers of interposed indium. Another processing of the germanium to provide a narrow effective spacing involves an etching of the germanium material to produce a thin layer. Still other mechanical processes provide the digging of cavities in the germanium body with the resultant mechanism weakening of the body. Another short-coming of the previous methods for providing a reduced effective spacing lies in the fact that the indium introduced does not uniformly wet the germanium surface and therefore leads to an irregularity in the rate and amount of diffusion. This irregularity in turn is reflected in a ragged penetration, all of which contributes to uncertainty in results.

A doping material introduced into a semiconductive element is capable of changing the conductance of the semiconducting material. Certain objectionable features have been experienced in the fusing of a doping material into a crystalline lattice. A very close temperature control is necessary if it is desired to diffuse the impurity into the transistor crystals efficiently so that the junction resides at an appreciable distance from the surface of the semiconductive crystal. While at the same time in achieving this maximum depth of diffusion the temperature must of necessity approach the melting point of the alloy of the semiconductive material and the impurity present on the surface of the crystal. It will be seen that it is desirable to avoid localizing surface melting during the diffusion of impurity and consequently it is necessary to closely control the temperature of devices so as to avoid such melting. The lowering of the temperature for diffusion slows the diffusion rate. To control or eliminate the local surface action during impurity diffusion may slow the diffusion rate to an impractical pace which requires hours and even days of diffusion in the achievement of the desired impurity penetration.

It is an object of this invention to provide a method of introducing an impurity into a single semiconductive crystal which will create a barrier layer within the semiconductive crystal.

It is another object of this invention to provide a junction transistor in which the effective spacing is reduced to a desired dimension and the mechanical strength of the semiconductive body is maintained.

Still another object of this invention is the introduction of a substance capable of changing the type of conductance into a semiconductive material by an easily reproducible technique.

Still another object of this invention is the provision of a process of diffusing into a semiconductive material a doping material without causing melting of the semiconductive material.

Still other objects of this invention include protecting the surface of the semiconductive material from converting from one type of conductance to another in the formation of a barrier layer and the easy control of the rate of introduction of an impurity into the semiconductive material by diffusion.

Other objects of this invention as well as the various advantages will become more apparent upon consideration of the following description:

Briefly, the invention consists of a series of steps in treating a crystalline body of either p or n conductance so as to change the type of conductance of a very small region of this body. First, a single crystal in which a barrier layer is to be placed is treated so as to form what is termed a quasi-barrier layer. This quasi-barrier layer is of any substance which may be formed or deposited on or at the surface of the crystal without diffusing sufficiently into the body of the crystal to affect the conductance. When the quasi-barrier layer is satisfactorily established on the crystal surface, an impurity to be diffused into the crystal is deposited upon this layer, as by electroplating or thermal deposition, and finally, the impurity is caused to diffuse into the positive crystalline body through the quasi-barrier layer; this layer serving to control the speed of diffusion of the impurity element. If desired, the quasi-barrier layer used with the invention can be removed from the semiconductive crystal either during the diffusion of the second component or during treatment of the host material following the formation of the p-n barrier junction. By this means, an impurity metal, when applied to a semiconductor, is separate from the semiconductor by a barrier which is any substance capable of suitably separating the impurity from the semiconductor and operating to effect a diffusion of the impurity to the semiconductor with a controlled diffusion. The barrier is selected and appropriately matched to the impurity so that the impurity diffuses through the barrier slower than through the semiconductor. Hence, no low melting alloy of the impurity can accumulate between the barrier and the semiconductor body since the impurity is removed from the region of the barrier at a faster rate by diffusion into the semiconductor than it is supplied by diffusion through the barrier.

By the process of this invention the diffusion of the impurity may be carried on at temperatures which will cause the diffusion of the impurity to an appreciable distance below the surface of the semiconductive crystal. This introduction of the impurity into the semiconductive material can be by rapid diffusion of the impurity at relatively high temperatures through the semiconductor and without bringing about the formation of a low melting alloy between the impurity and the semiconductor in the vicinity of the semiconductor surface.

The barrier layer may be an adherent oxide film, an interstitial alloy formed at the surface of the semiconductive material by the barrier material or an alloy layer made up of the semiconductive material and an element from the same group of the periodic table. In the instance of the alloy layer, after diffusion the alloying substance may be readily removed from the surface by acid solution or some similar treatment. This barrier layer does not diffuse at appreciably the same rate as the doping material. It is the purpose of this invention to provide a barrier layer which will remain on the semiconductive material throughout the diffusion operation and which then may be removed from the surface at the completion of the diffusion operation. This removal can be arranged not to affect the conductance of the semiconductive material as determined by the diffused impurity.

The barrier layer is applied by various methods. In the application of the oxide barrier layer, the layer may be formed by oxidation for a sufficient period to form the oxide of the semiconductive material on the surface and thus form a barrier layer. The oxide barrier layer may also be applied by anodic oxidation in an aqueous bath. The oxide barrier layer may also be formed by the reduction of an oxide gas in contact with the semiconductive material. The oxide gas in this method is reduced at the surface of the body and the surface of the body becomes oxidized forming a barrier. The reduced element diffuses throughout the barrier so formed. Suitable elements for the formation of the oxide gas are arsenic, antimony, boron and phosphorous for use with silicon as the semiconductive material. These elements formed into an oxide will be reduced to form the oxide layer. The oxide barrier layer on the semiconductive material may also be produced by the method of applying or introducing the oxide of an element to or into the surface of the semiconductive body in solid state. The oxide is then reduced as by heat to form the oxide barrier layer with the removal of the reduced element. The following examples illustrate the formation of an oxide barrier film in accordance with the teachings of this invention.

*Example I*

A wafer of a single crystal of germanium approximately five mils thick and 10 millimeters square was oxidized in a heated atmosphere at an air temperature of 750° C. for a period of ten minutes.

*Example II*

A wafer of a single crystal of germanium approximately five mils thick and ten millimeters square was oxidized as an anode in an equeous bath saturated with boric acid through which was passed a current of 40 amps. per square centimeter of anode area at a voltage of 600 volts.

*Example III*

A silicon wafer was heated at 1200° C. for one hour in nitrogen gas bubbled through water at 30° C. to form a continuous protective envelope of non-volatile silicon dioxide. The silicon dioxide layer was a thickness of about 2500° Angstrom units.

The quasi-barrier layer may be formed by an interstitial component upon the surface of a host semiconductive single crystalline body. The barrier layer having an interstitial component is formed by a suitable interstice permeant which occupies positions in the interstices of the host crystalline lattice. Specifically, these components are non-metallic elements such as hydrogen, boron, carbon and nitrogen. These elements take position in the crystalline lattice and form effective barriers. The layer formed by such an interstice permeant is adherent to the surface of the semiconductive material. The following examples illustrate the application of an interstitial component to a single crystalline semiconductor.

*Example IV*

A wafer of a single crystal of germanium of approximately five mils thick and ten millimeters square was heated in a nitrogen atmosphere at 850° C. for twenty minutes to produce a quasi-barrier interstitial solid solution surface.

*Example V*

A wafer of a single crystalline semiconductor as set forth in Example IV was heated in an atmosphere of hydrogen at 600° C. for a period of ten minutes to produce on the wafer a quasi barrier of an interstitial solid solution surface.

In the interstitial solid solutions described in the above examples a stoichiometric composition is not necessary. The formation of an interstitial solid solution of a nitride, a hydride, a carbide or a boride can be produced without regard to the exact proportions of the interstitial component. A quasi-barrier layer of an interstitial nitride may be applied by heating a single crystalline semiconductor in ammonia vapors.

*Example VI*

A wafer of a single crystalline semiconductor as set forth in Example IV was heated at a temperature of 900° C. for a period of one hour at one atmosphere of pressure in boron tetrachloride with hydrogen. A layer of boride-containing interstitial substituent was applied to the crystalline semiconductor.

Similarly, carbides can be formed as interstitial substituents according to this invention by the use of aliphatic hydrocarbons such as, for example, methane, ethane, and preferably natural gas mixed together with a reducing hydrogen, and brought into contact with surfaces of the crystalline semiconductor at temperatures and conditions to form a quasi-barrier state of the carbide in the surface of the semiconductor.

*Example VII*

A wafer of a single crystal of silicon approximately five mils thick and ten millimeters square was formed with a barrier layer on its surface of silicon carbide by passing equal parts of methane and hydrogen over the wafer at a temperature of 800° C. at a pressure of one atmosphere for a period of one hour.

A substitutional primary solid solution occurs when foreign or solute atoms replace atoms of the solvent metal. This is distinguished from the interstitial solid solution in which the foreign or solute atoms take up positions between the atoms of the lattice. The substitutional quasi-barrier layers are formed by the application of an element such as for example zirconium, titanium or lead to a germanium or silicon semiconductor. The substituent component fits within the crystalline lattice of the host semiconductive material wihout substantial melting during the process. The substituent is of the same periodic group as the semiconductor or lower in the periodic system than the host material of germanium or silicon. The following example illustrates the use of a suitable substituent material.

*Example VIII*

A single crystal of germanium approximately five mils thick and ten millimeters square was plated on its surface with a layer of tin approximately one mil thick, and heated at a temperature of 925° C. for a period of one hour to form a substitutional quasi barrier on the surface of the wafer.

It will be understood that the method of forming an interstitial component barrier and a substitutional barrier can be combined in carrying out the broad teachings of this invention. This application of the barrier layer may be accomplished by vapor phase deposition of the interstitial components on the surface of the single crystal semiconductor.

*Example IX*

A wafer of single crystal germanium semiconductor approximately five mils thick and ten millimeters square was heated in an atmosphere of hydrogen, methane and tantalum chloride at 900° C. for a period of ten minutes. A tantalum carbide barrier layer was produced on the surface of the semiconductor wafer.

Other quasi-barrier layers of a combined interstitial component and substitutional material such as layers of titanium boride can be produced by treating the surfaces of the single crystalline germanium or silicon semiconductors with titanium chloride, boron tetrachloride and hydrogen at 800° C. for one-half hour.

Once a quasi-barrier layer as described above has been created, the secondary component which it is desired to diffuse into the host monocrystalline material in order to change conductivity of this material can be readily placed upon the surface of this quasi-barrier layer as by dipping within a molten body of this material, or by the application of a comparatively low melting solder containing such an element or by electroplating techniques. Such techniques are well-known to the industry and individually form no part of the instant inventive concept. For purposes of reference only, the article by Saby, entitled "Purified Impurity p-n-p Junction Transistors," on pages 1358 to 1360, volume 40, No. 11, Proceedings of the Institute of Radio Engineers (November 1952), is cited.

Once the material to be diffused in the crystalline structure of the host semiconductor is placed upon a quasi-barrier layer as described, the actual diffusion may be carried out at an elevated temperature usually within the range of from 700 to 950° C. without any precise amount of temperature control being required and without danger of the formation of a low melting alloy of the impurity and the host crystalline material. In the prior art, diffusion of "acceptor" and "donor" impurity elements into germanium generally was within the range of 200° C. and 700° C. and at temperatures above 800° C. was impossible due to the formation of low melting point alloys and inability to control the rate of impurity diffusion. Furthermore, to obtain controllable diffusion the temperature of diffusion could vary only within a small range of plus or minus one degree centigrade. As an example of this, indium is diffused into germanium at 250° C. in accordance with the prior art. With the present invention no such close temperature control is necessary and much higher temperatures can be used to more rapidly effect the diffusion of the impurity into the crystalline lattice. Thus, a process as herein taught marks a substantial improvement. As an example of this process forming a p-type layer in n-germanium as indicated in the preceding paragraph, it is satisfactory to heat a combination of n-type germanium to which there is applied a quasi-barrier layer and then a layer of arsenic, to a temperature of 900° C. plus or minus 50° C. for a period of twenty minutes. If indium is used as the secondary component to be diffused into the crystal, approximately the same range of temperatures can be satisfactorily employed. As an example of this, a wafer of n-type silicon in which can be coated a quasi barrier as described above and then provided with an adherent layer of an indium-containing solder (85% lead, 15% indium), and then heated at 1300° C. plus or minus 100° C. for a period of thirty minutes.

Another embodiment of the method of diffusing into the host monocrystalline semiconductor employs a solvent for the doping material which does not act upon the barrier material. For example, molten lead or molten potassium cyanide would attack the semiconductor material but will not attack the barrier layer as set forth herein. The doping material dissolved in these solvents is applied by the immersion of the layered semiconductor material in the solution of doping material and solvent. In this way an accurate control of the surface concentration of the doping material is achieved at the semiconductor surface.

If desired, when oxide layers are used as the quasi barriers, these oxides can be thermally reduced by hydrogen during the diffusion process. When this is the case, the degree of the reduction of the oxide in turn tends to govern the speed with which the secondary component diffuses into the crystalline structure of the host semiconductor. As an example of this type of process, a germanium crystal anodically oxidized as described above and provided with an indium solder layer on the oxide can be treated in hydrogen at 950° C. for a period of five minutes to create a p-n junction.

The barrier layers described above may include a sulfide layer applied by the above-described methods. It is a feature of this invention that a sulfide barrier layer would immobilize certain undesirable impurities, for example copper and nickel. Certain prevalent impurities may act as spurious doping materials in the production of semiconductor bodies. These impurities, such as copper, lithium and nickel, tend to diffuse rapidly in germanium and silicon. Consequently, any trace of such elements present during sensitive stages of the semiconductor production will be incorporated in the semiconductor in diffusion. A sulfide barrier layer counteracts this sensitivity.

The precise heating means employed with the invention are comparatively immaterial. Frequently, it is desirable to employ an induction field arranged so as to melt a secondary component being diffused into the crystalline structure of the first, but not melting the host material. The precise furnaces and the like, generally used, are well-known in the art. If desired, the individual surfaces of the semiconductive crystal, being treated as herein described, may be cleaned by electron bombardment or chemical etching prior to carrying out the process described. Also, the quasi-barrier layers described can be removed following diffusion process indicated by the use of electron bombardment or chemical etching. As an example of the latter, concentrated hydrochloric acid can be used to dissolve out the substitutional alloying ingredients described above.

As many apparently widely different embodiments of this invention may be made without departing from the spirit and scope hereof, it is to be understood that the invention is not limited to the specific embodiments hereof except as defined in the appended claims. This application is a continuation-in-part of copending application Serial No. 388,690, filed October 27, 1953, now Patent No. 2,823,149, issued February 11, 1958.

What is claimed is:

1. A process for producing a barrier layer within a body of a crystalline semiconductive material which comprises heating at a temperature in the range of 700° to 1300° C., said semiconductive material in an atmosphere of a non-metal gas capable of reacting with the surface of the semiconductive material in the said temperature range, thereby permeating said non-metal gas in the interstices at the surface of said crystalline material to form on the surface thereof an interstitial barrier adapted to afford a controlled diffusion therethrough of an element capable of changing the conductivity of the said semiconductive material, the diffusion of the said element through the barrier being slower than through the said semiconductive material, depositing said element capable of changing the conductivity of said semiconductive material upon said interstitial alloy barrier surface, and heating the combination to a temperature in the range of 750° to 1300° C. to cause said element alone to diffuse into the crystalline lattice of the semiconductive material through said interstitial alloy barrier, the said barrier being substantially free from any melting during the process thereby avoiding the presence of a low melting alloy of the element and the semiconductive material between the latter and the barrier.

2. A process of producing a p–n barrier layer as defined in claim 1 above wherein said alloy layer is reduced back to the semiconductive material while said element is being diffused through said alloy layer.

3. A process of producing a barrier layer within a body of crystalline semiconductive material which comprises forming upon the surface of said material a substitutional alloy comprising a metal of the same periodic group as the semiconductive material through which diffusion is more difficult than through the semiconductive material, said substitutional alloy containing an interstitial element selected from the group consisting of zirconium, titanium, lead and tin, depositing an element capable of changing the conductivity of said material upon said substitutional alloy surface, and heating the combination to a temperature in the range of 700° to 1300° C. to cause said element to diffuse into the crystalline lattice of said semiconductive material through said unmelted substitutional alloy.

4. A process for producing a barrier layer within a body of crystalline semiconductive material which comprises first heating the said semiconductive material at a temperature in the range of 700° C. to 1300° C. with hydrogen gas and a mixture of compounds selected from the group consisting of a methane and tantalum chloride mixture and a titanium chloride, boron tetrachloride mixture, thereby permeating said gas in the interstices at the surface of said crystalline material and forming a substitutional alloy upon the surface of said material to form on the surface thereof a barrier adapted to afford a controlled diffusion therethrough of an element capable of changing the conductivity of said semiconductive material, the diffusion of the said element through the barrier being slower than through the said semiconductive material, then depositing said element capable of changing the conductivity of said semiconductive material upon said alloy barrier surface, and heating the combination to a temperature in the range of 750° to 1300° C. to cause said element alone to diffuse into the crystalline lattice of the semiconductive material through said alloy barrier, the said barrier being substantially free from any melting during the process, thereby avoiding the presence of a low melting alloy of the element and the semiconductive material between the latter and the barrier.

References Cited in the file of this patent

UNITED STATES PATENTS 2,781,481 Armstrong ............. Feb. 12, 1957